US010847541B2

(12) United States Patent
Yoo

(10) Patent No.: US 10,847,541 B2
(45) Date of Patent: Nov. 24, 2020

(54) FERROELECTRIC MEMORY DEVICE AND A METHOD OF MANUFACTURING THE SAME

(71) Applicant: SK hynix Inc., Icheon-si (KR)

(72) Inventor: Hyangkeun Yoo, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 16/016,603

(22) Filed: Jun. 24, 2018

(65) Prior Publication Data

US 2019/0019801 A1    Jan. 17, 2019

(30) Foreign Application Priority Data

Jul. 14, 2017    (KR) ................... 10-2017-0089925

(51) Int. Cl.
| H01L 27/1159 | (2017.01) |
| H01L 29/66 | (2006.01) |
| H01L 21/02 | (2006.01) |
| G11C 11/22 | (2006.01) |
| H01L 29/51 | (2006.01) |
| H01L 29/78 | (2006.01) |

(Continued)

(52) U.S. Cl.
CPC ........ *H01L 27/1159* (2013.01); *G11C 11/223* (2013.01); *G11C 11/2273* (2013.01); *G11C 11/2275* (2013.01); *H01L 21/0234* (2013.01); *H01L 21/02181* (2013.01); *H01L 21/02189* (2013.01); *H01L 21/02304* (2013.01); *H01L 21/02321* (2013.01); *H01L 21/02356* (2013.01); *H01L 21/02362* (2013.01); *H01L 21/31155* (2013.01); *H01L 29/40111* (2019.08); *H01L 29/513* (2013.01); *H01L 29/516* (2013.01); *H01L 29/517* (2013.01); *H01L 29/6684* (2013.01); *H01L 29/78391* (2014.09)

(58) Field of Classification Search
None
See application file for complete search history.

(56) References Cited

U.S. PATENT DOCUMENTS

| 5,471,364 A * | 11/1995 | Summerfelt ........... H01G 4/306 257/295 |
| 6,617,206 B1 * | 9/2003 | Sandhu ............. H01L 21/31654 438/240 |
| 8,906,704 B2 | 12/2014 | Wang |

(Continued)

FOREIGN PATENT DOCUMENTS

JP    10107216 A  *  4/1998

*Primary Examiner* — Davienne N Monbleau
*Assistant Examiner* — Scott R Wilson

(57) ABSTRACT

There is disclosed a method of manufacturing a ferroelectric memory device according to one embodiment. In the method, a substrate is prepared. An interfacial insulating layer is formed on the substrate. A ferroelectric material layer is formed on the interfacial insulating layer. An interfacial oxide layer including a first metal element is formed on the ferroelectric material layer. A gate electrode layer including a second metal element is formed on the interfacial oxide layer. The ferroelectric material layer and the interfacial oxide layer are subjected to a crystallization heat treatment to form a ferroelectric layer and a ferroelectric interfacial layer. The interfacial oxide layer reacts with the gate electrode layer so that the ferroelectric interfacial layer includes the first and second metal elements.

13 Claims, 19 Drawing Sheets

(51) Int. Cl.
*H01L 21/28* (2006.01)
*H01L 21/3115* (2006.01)

(56) References Cited

U.S. PATENT DOCUMENTS

| | | | | |
|---|---|---|---|---|
| 2005/0213282 | A1* | 9/2005 | Kondo | C30B 23/02 |
| | | | | 361/311 |
| 2009/0261395 | A1* | 10/2009 | Boescke | G11C 11/22 |
| | | | | 257/295 |
| 2010/0221905 | A1* | 9/2010 | Hautala | H01L 29/7881 |
| | | | | 438/591 |
| 2011/0014359 | A1* | 1/2011 | Hashim | C23C 16/405 |
| | | | | 427/80 |
| 2011/0204479 | A1* | 8/2011 | Wang | H01L 28/65 |
| | | | | 257/532 |
| 2015/0333258 | A1 | 11/2015 | Fujii et al. | |
| 2015/0357429 | A1* | 12/2015 | Dubourdieu | H01L 29/4966 |
| | | | | 257/295 |
| 2017/0162250 | A1* | 6/2017 | Slesazeck | H01L 27/1159 |

* cited by examiner

FERROELECTRIC MEMORY DEVICE AND A METHOD OF MANUFACTURING THE SAME

CROSS-REFERENCE TO RELATED APPLICATION

The present application claims priority under 35 U.S.C 119(a) to Korean Patent Application No. 10-2017-0089925, filed on Jul. 14, 2017, which is herein incorporated by reference in its entirety.

BACKGROUND

1. Technical Field

Various embodiments of the present disclosure generally relate to a semiconductor device, and more particularly, relate to a ferroelectric memory device and a method of manufacturing the same.

2. Related Art

Generally, a ferroelectric material refers to a material having spontaneous electrical polarization in a state in the absence of an applied external electric field. In addition, the ferroelectric material can be controlled to maintain one of at least two stable remanent polarization states on a ferroelectricity hysteresis curve. The ferroelectric material can be utilized in memory devices to store logic information of "0" or "1" in a nonvolatile manner.

Recently, a field effect transistor type ferroelectric memory device, in which the ferroelectric material is used as a gate dielectric layer, has been studied. A writing operation of the ferroelectric memory device may be performed by applying a predetermined or known writing voltage to a gate electrode layer, and storing different states of remanent polarization in the gate dielectric layer as logic information. A reading operation of the ferroelectric memory device may be performed by reading an operation current passing through a channel layer of the field effect transistor. The channel resistance of channel layer in the field effect transistor changes depending on different remanent polarization states that can be written in the gate dielectric layer.

SUMMARY

There is disclosed a method of manufacturing a ferroelectric memory device according to an aspect of the present disclosure. In the method, a substrate is prepared. An interfacial insulating layer is formed on the substrate. A ferroelectric material layer is formed on the interfacial insulating layer. An interfacial oxide layer including a first metal element is formed on the ferroelectric material layer. A gate electrode layer including a second metal element is formed on the interfacial oxide layer. The ferroelectric material layer and the interfacial oxide layer are subjected to a crystallization heat treatment to form a ferroelectric layer and a ferroelectric interfacial layer. The interfacial oxide layer react with the gate electrode layer so that the ferroelectric interfacial layer includes the first and second metal elements.

There is disclosed a method of manufacturing a ferroelectric memory device according to another aspect of the present disclosure. In the method, a substrate is prepared. An interfacial insulating layer is formed on the substrate. A ferroelectric material layer is formed on the interfacial insulating layer. A surface treatment is performed on the ferroelectric material layer. A gate electrode layer is formed on the surface-treated ferroelectric material layer. The ferroelectric material layer is subjected to a crystallization heat treatment to form a ferroelectric layer, wherein a ferroelectric interfacial layer is formed between the ferroelectric layer and the gate electrode layer during the crystallization heat treatment.

There is disclosed a ferroelectric memory device according to another aspect of the present disclosure. The ferroelectric memory device includes a substrate, an interfacial insulating layer pattern disposed on the substrate, a ferroelectric layer pattern disposed on the interfacial insulating layer pattern, a ferroelectric interfacial layer pattern disposed on the ferroelectric layer pattern, and a gate electrode pattern disposed on the ferroelectric interfacial layer pattern. The ferroelectric interfacial layer pattern includes at least one metal element identical to a metal element in the gate electrode pattern.

DETAILED DESCRIPTION

Figure 1:
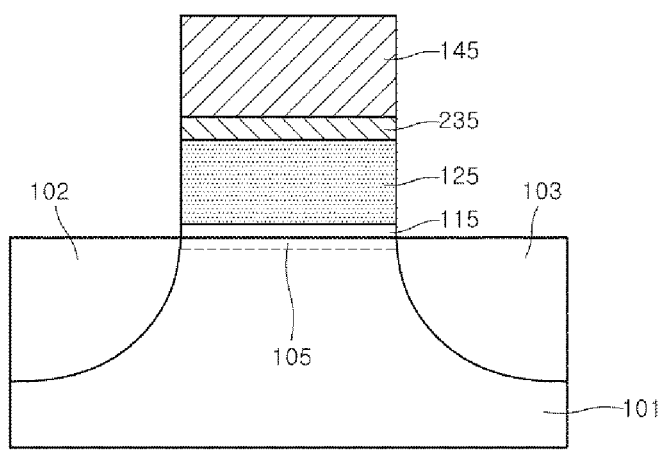
FIG. 1 is a cross-sectional view schematically illustrating a ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, then it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition of one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a cross-sectional view schematically illustrating a ferroelectric memory device 1 according to an embodiment of the present disclosure. Referring to FIG. 1, the ferroelectric memory device 1 may include a substrate 101, an interfacial insulating layer pattern 115, a ferroelectric layer pattern 125, a ferroelectric interfacial layer pattern 235, and a gate electrode pattern 145. The ferroelectric memory device 1 may be a transistor type memory device that implements different channel resistances depending on remanent polarization orientations stored in the ferroelectric layer pattern 125.

The ferroelectric memory device 1 described in this embodiment may perform memory operations as follows. With respect to a writing operation, a polarization orientation may be established inside the ferroelectric layer pattern 125 when a preset writing voltage is applied through the gate electrode pattern 145. A remanent polarization, having a similar polarization orientation, may be retained in the ferroelectric layer pattern 125 after the writing voltage is removed. The recorded remanent polarization may correspond to a logic information. The remanent polarization may induce electrons to move into a channel region 105 in the substrate 101, induce electrons to move out from the channel region 105, or induce electric charges, such as holes, to migrate into the channel region 105.

The channel region 105 herein is a region located in the substrate 101 beneath the interfacial insulating layer pattern 115, corresponds to a region in which electrically conductive carriers are concentrated. A channel, which is a path through which the carriers conduct between a source region 102 and a drain region 103, may be formed in the channel region 105. As used herein, the electrical resistance of the channel will be referred to as a channel resistance.

With respect to a reading operation of the ferroelectric memory device 1, when a reading voltage is applied to the gate electrode pattern 145, a channel resistance between the source region 102 and the drain region 103 may vary depending on the type and amount of the electric charges attracted into the channel region 105 by the remanent polarization. In an embodiment, with respect to a ferroelectric memory device in the form of an n-type field effect transistor, as the density of electrons induced in the channel region 105 increases, the channel resistance decreases. It is possible to read out the logic information stored in the ferroelectric memory device 1 by measuring the change in the channel resistance.

The substrate 101 may include, for example, a semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped to have conductivity. As an example, the substrate 101 may be doped with a p-type dopant. As another example, the substrate 101 may have at least a p-type doped region in substrate 101 below a ferroelectric structure 10.

The source region 102 and the drain region 103 may be disposed in the substrate 101 at opposite ends or sides of the interfacial insulating layer pattern 115. In an embodiment, the source region 102 and the drain region 103 are both an n-type doped regions.

The interfacial insulating layer pattern 115 may be formed or disposed on the substrate 101. The interfacial insulating layer pattern 115 may be interposed or sandwiched between the substrate 101 and the ferroelectric layer pattern 125 to suppress diffusion of materials between the substrate 101 and the ferroelectric layer pattern 125 during the manufacturing process. In addition, the interfacial insulating layer pattern 115 can prevent direct contact between the substrate 101 and the ferroelectric layer pattern 125. Therefore, defects produced by differences in crystal lattice strain at the interface between the substrate 101 and the ferroelectric layer pattern 125 are suppressed or minimized.

The interfacial insulating layer pattern 115 may include, for example, silicon oxide, silicon nitride, silicon oxynitride, or aluminum oxide. In an embodiment, when the substrate 101 is a silicon (Si) substrate, the interfacial insulating layer pattern 115 may be a silicon oxide layer, a silicon nitride layer, or a silicon oxynitride layer.

The ferroelectric layer pattern 125 may be formed or disposed on the interfacial insulating layer pattern 115. The ferroelectric layer pattern 125 may include a ferroelectric material having remanent polarization therein. In embodiments, the remanent polarization can induce electrons into the channel region 105 in the substrate 101 or can eject electrons from the channel region 105. The channel resistance between the source region 102 and the drain region 103 can be influenced by the density of the electrons distributed in the channel region 105. The ferroelectric layer pattern 125 may have a thickness of about seven (7) nanometers (nm) to about fifteen (15) nm.

In an embodiment, the ferroelectric layer pattern 125 may include a crystalline metal oxide. The ferroelectric layer pattern 125 may include a binary metal oxide. The ferroelectric layer pattern 125 may include, for example, hafnium oxide, zirconium oxide, or a combination thereof. In embodiments, the ferroelectric layer pattern 125 may have an orthorhombic crystal structure.

In an embodiment, the ferroelectric layer pattern 125 may include at least a kind of dopant. The dopant may be uniformly distributed in the ferroelectric layer pattern 125. The dopant distributed in the ferroelectric layer pattern 125 may stabilize the ferroelectricity of the ferroelectric layer pattern 125. When the ferroelectric layer pattern 125 includes one of hafnium oxide, zirconium oxide or a combination thereof, the ferroelectric layer pattern 125 may include a dopant having a valence of two (2) to four (4). As an example, the ferroelectric layer pattern 125 may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination thereof.

The ferroelectric interfacial layer pattern 235 may be formed or disposed on the ferroelectric layer pattern 125. The ferroelectric interfacial layer pattern 235 may have ferroelectricity. The ferroelectric interfacial layer pattern 235 may have a thickness of, for example, about one (1) nm to about one and one-half (1.5) nm. The ferroelectric interfacial layer pattern 235 may be formed by replacing a paraelectric interfacial dielectric layer, which forms during the manufacturing process of the ferroelectric memory device 1 at the interface between the ferroelectric layer pattern 125 in direct contact with the gate electrode pattern 145.

In a comparative example with ferroelectric memory device 2 described below and with reference to FIGS. 16A and 16B, when an interfacial dielectric layer pattern 155 having paraelectricity is formed between the ferroelectric layer pattern 125 and the gate electrode pattern 145, negative electric charges 125e caused by remanent polarization Pr1 in the ferroelectric layer pattern 125 may be arranged near an interface S1. The interfacial dielectric layer pattern 155 having paraelectricity may not have enough positive electric charges 125h to sufficiently screen or neutralize the negative electric charges 125e in the region adjacent to the interface S1. Accordingly, a depolarization electric field $E_d$ may be generated in the ferroelectric layer pattern 125 by the separation of positive charges 125h and unscreened negative electric charges 125e. The depolarization electric field $E_d$ may be formed in a direction opposite to the remnant polarization Pr1, and it may reduce the magnitude of the remnant polarization Pr1. As a result, the ferroelectric characteristics of the ferroelectric layer pattern 125 may be degraded.

Figure 17A:
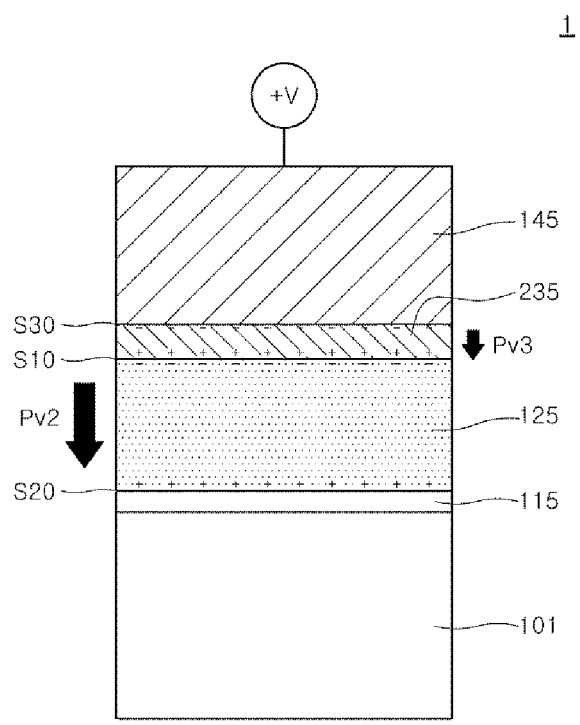
FIGS. 17A and 17B are views schematically illustrating operations of a ferroelectric memory device according to an embodiment of the present disclosure.
Figure 17B:
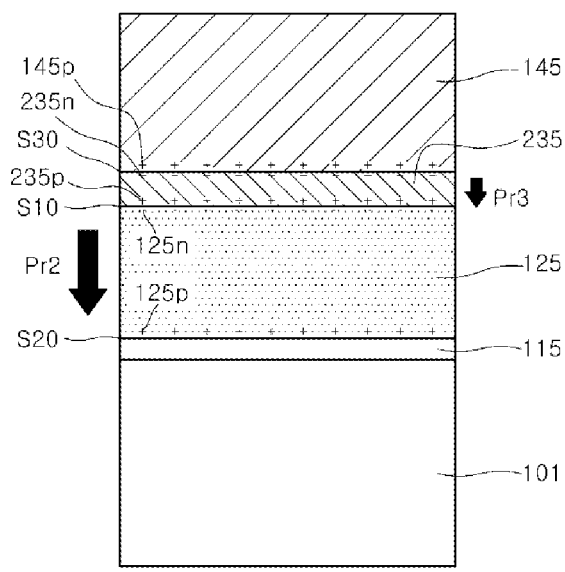

In contrast, according to an embodiment of the present disclosure, in connection with ferroelectric memory device 1 and FIGS. 17A and 17B, when a ferroelectric interfacial layer pattern 235 having ferroelectricity (as compared to a paraelectric interfacial dielectric layer) is formed between the ferroelectric layer pattern 125 and the gate electrode pattern 145, because both the ferroelectric layer pattern 125 and the ferroelectric interfacial layer pattern 235 are ferroelectric, electric charges can be offset from each other at an interface $S_{10}$. In addition, because the gate electrode pattern 145 also has electric charges, opposite electric charges can be offset from each other at an interface $S_{30}$ between the ferroelectric interfacial layer pattern 235 and the gate electrode pattern 145. Therefore, in embodiments of the present disclosure, potential depolarization electric fields formed inside the ferroelectric interfacial layer pattern 235 and the ferroelectric layer pattern 125 can be suppressed or minimized.

As described above, the ferroelectric interfacial layer pattern 235 may be disposed in place of the interfacial dielectric layer having paraelectricity, so that a depolarization electric field that might reduce the magnitude of the remnant polarization of the ferroelectric layer pattern 125 can be suppressed or its effects limited.

The ferroelectric interfacial layer pattern 235 may include a ferroelectric metal oxide. The ferroelectric interfacial layer pattern 235 may have at least one metal element that is the same as a metal element contained in the gate electrode pattern 145. In an embodiment, when the gate electrode pattern 145 includes titanium (Ti) or titanium nitride (TiN), the ferroelectric interfacial layer pattern 235 may include at least one of strontium titanium oxide ($SrTiO_3$), barium titanium oxide ($BaTiO_3$), and yttrium titanium oxide ($YTiO_3$). In another embodiment, when the gate electrode pattern 145 includes tantalum (Ta) or tantalum nitride (TaN), the ferroelectric interfacial layer pattern 235 may include potassium tantalum oxide ($KTaO_3$). In yet another embodiment, when the gate electrode pattern 145 includes tungsten (W) or tungsten nitride (WN), the ferroelectric interfacial layer pattern 235 may include sodium tungsten oxide ($NaWO_3$).

The gate electrode pattern 145 may be formed or disposed on the ferroelectric layer pattern 125. The gate electrode pattern 145 may include a conductive material. The gate electrode pattern 145 may include, for example, titanium (Ti), tantalum (Ta), tungsten (W), titanium nitride (TiN), tantalum nitride (TaN), tungsten nitride (WN), or a combination of two or more thereof.

As described above, the ferroelectric memory device according to an embodiment of the present disclosure may include a ferroelectric interfacial layer pattern disposed between the ferroelectric layer pattern and the gate electrode pattern. Using the ferroelectric interfacial layer pattern, it is possible to suppress an interfacial dielectric layer having paraelectricity from being formed between the ferroelectric layer pattern and the gate electrode pattern during the manufacturing process of the ferroelectric memory device. The interfacial dielectric layer can result in a depolarization electric field that degrades the ferroelectricity of the ferroelectric layer pattern. However, the generation of the depolarization electric field can be suppressed or limited by replacing the interfacial dielectric layer with a ferroelectric interfacial layer pattern.

Figure 2:
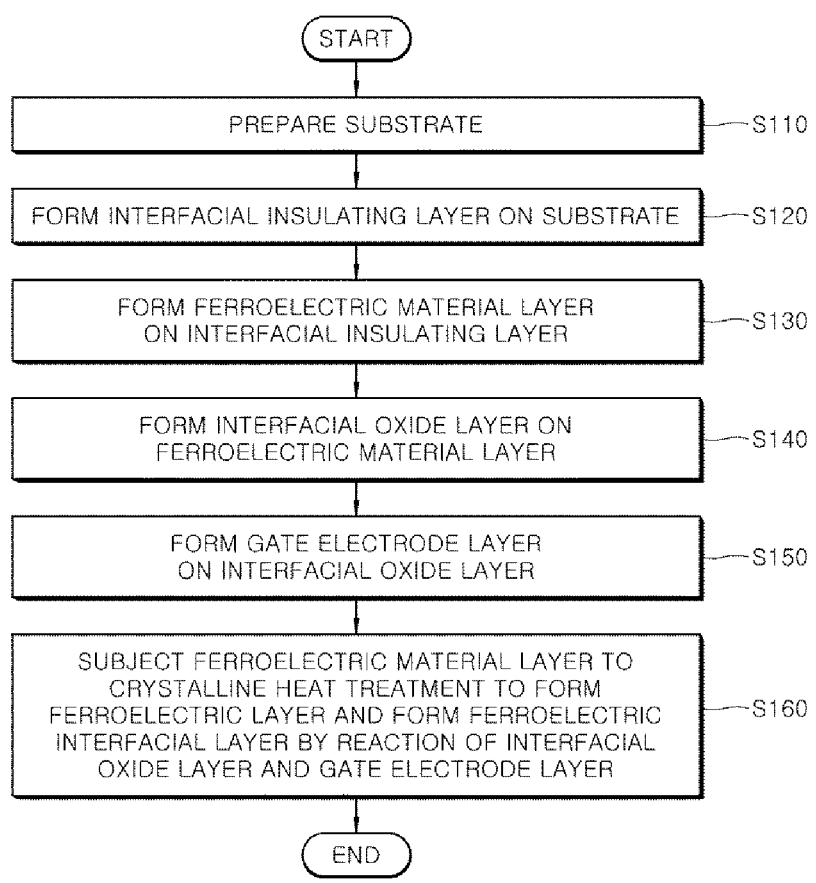
FIG. 2 is a flow chart illustrating a method of manufacturing a ferroelectric memory device according to an embodiment of the present disclosure.

FIG. 2 is a flow chart illustrating a method of manufacturing a ferroelectric memory device according to an embodiment of the present disclosure. FIGS. 3 to 6 are cross-sectional views schematically illustrating a method of manufacturing the ferroelectric memory device according to an embodiment of the present disclosure.

Figure 3:
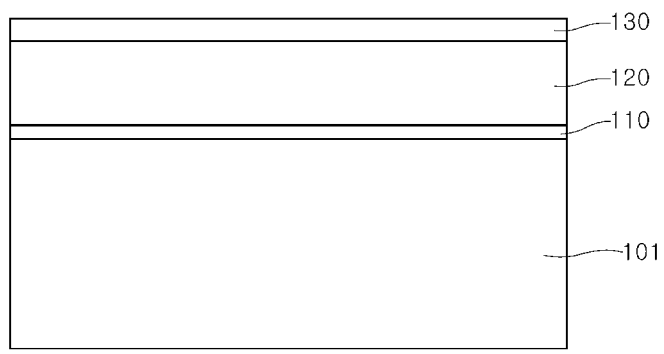
FIGS. 3 to 6 are cross-sectional views schematically illustrating a method of manufacturing a ferroelectric memory device according to an embodiment of the present disclosure.
Figure 3:
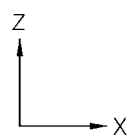

Referring to operation S110 of FIG. 2 and FIG. 3, a substrate 101 may be prepared. The substrate 101 may include a semiconductor material. The substrate 101 may, for example, be a silicon (Si) substrate, a gallium arsenide (GaAs) substrate, an indium phosphide (InP) substrate, a germanium (Ge) substrate, or a silicon germanium (SiGe) substrate. The substrate 101 may be doped to have conductivity.

Referring to operation S120 of FIG. 2 and FIG. 3, an interfacial insulating layer 110 may be formed or disposed on the substrate 101. The interfacial insulating layer 110 may include, for example, silicon oxide, silicon nitride, silicon oxynitride, or aluminum oxide. The interfacial insulating layer 110 may be formed, for example, using a chemical vapor deposition method, an atomic layer deposition method and the like.

Referring to operation S130 of FIG. 2 and FIG. 3, a ferroelectric material layer 120 may be formed or disposed on the interfacial insulating layer 110. The ferroelectric material layer 120 may be formed in an amorphous state. In an embodiment, the ferroelectric material layer 120 may include a binary metal oxide. The ferroelectric material layer 120 may include, for example, hafnium oxide, zirconium oxide, or a combination thereof. The ferroelectric material layer 120 may be formed, for example, using a chemical vapor deposition method, an atomic layer deposition method and the like.

In an embodiment, the ferroelectric material layer 120 may include at least one kind of dopant. The dopant may be uniformly distributed in the ferroelectric material layer 120. As an example, when the ferroelectric material layer 120 includes one of hafnium oxide, zirconium oxide, or a combination thereof, the ferroelectric material layer 120 may include a dopant having a valence of 2 to 4. The dopant can stabilize the ferroelectricity of the crystallized ferroelectric material layer 120 after the ferroelectric material layer 120 is crystallized.

Referring to operation S140 of FIG. 2 and FIG. 3, an interfacial oxide layer 130 may be formed or disposed on the ferroelectric material layer 120. The interfacial oxide layer 130 may include a metal oxide containing a first metal element. The selection of the metal oxide containing the first metal element may be determined depending on the materials in a gate electrode layer 140 containing a second metal element, to be described later and with reference to operation S150 of FIG. 2 and FIG. 4. The metal oxide in interfacial oxide layer 130 may react with materials in gate electrode layer 140, and then interfacial oxide layer 130 can be converted into a ferroelectric material containing first and second metal elements during a crystallization heat treatment process described below and with reference to operation S160 of FIG. 2 and FIG. 5. Accordingly, the metal oxide of the interfacial oxide layer 130 may be selected to react with material in the gate electrode layer 140 to result in a ferroelectric interfacial layer 230 with ferroelectric properties.

In an embodiment, when the gate electrode layer 140 includes titanium (Ti) or titanium nitride (TiN), the interfacial oxide layer 130 may include strontium oxide (SrO). In another embodiment, when the gate electrode layer 140 includes titanium (Ti) or titanium nitride (TiN), the interfacial oxide layer 130 may include barium oxide (BaO). In yet another embodiment, when the gate electrode layer 140 includes titanium (Ti) or titanium nitride (TiN), the interfacial oxide layer 130 may include yttrium oxide ($Y_2O_3$). The interfacial oxide layer 130 may be formed, for example, using a chemical vapor deposition method, an atomic layer deposition method and the like.

Figure 4:
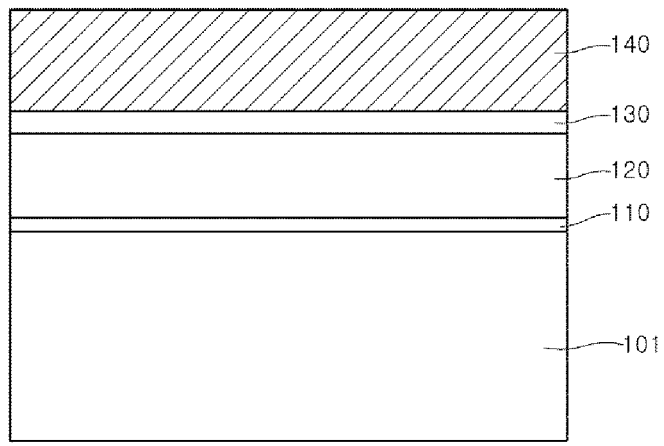

Referring to operation S150 of FIG. 2 and FIG. 4, the gate electrode layer 140 may be formed or disposed on the interfacial oxide layer 130. The gate electrode layer 140 may be positioned over the ferroelectric material layer 120 and the interfacial oxide layer 130.

The gate electrode layer 140 may include a second metal element that is different from the first metal element in the metal oxide of interfacial oxide layer 130. The gate electrode layer 140 may include, for example, titanium (Ti), tantalum (Ta), tungsten (W), titanium nitride (TiN), tantalum nitride (TaN), tungsten nitride (WN), or a combination of two or more thereof. The gate electrode layer 140 may be formed, for example, utilizing a chemical vapor deposition method, an atomic layer deposition method, or a sputtering method.

Figure 5:
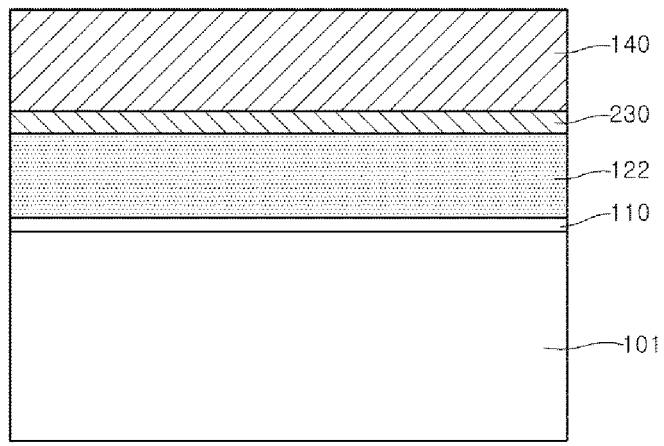

Referring to operation S160 of FIG. 2 and FIG. 5, the ferroelectric material layer 120 may be subjected to crystallization heat treatment to form a ferroelectric layer 122. The crystallization heat treatment may be performed, for example, at a processing temperature of about 500 degrees Celcius (° C.) to about 1000° C. The crystallization heat treatment may be performed with the gate electrode layer 140 disposed on the interfacial oxide layer 130. The gate electrode layer 140 may function as a capping layer for the ferroelectric material layer 120 and the interfacial oxide layer 130 during the crystallization heat treatment. The ferroelectric layer 122 may have a thickness of about seven (7) nm to about fifteen (15) nm, for example.

In the crystallization heat treatment process, the interfacial oxide layer 130 reacts with the gate electrode layer 140 to form a ferroelectric interfacial layer 230 having ferroelectricity. The ferroelectric interfacial layer 230 may be an oxide layer containing the first and second metal elements. The ferroelectric interfacial layer 230 may have a thickness of about one (1) nm to about one and one-half (1.5) nm.

In an embodiment, when the interfacial oxide layer 130 includes strontium oxide (SrO) and the gate electrode layer 140 includes titanium (Ti) or titanium nitride (TiN), then the ferroelectric interfacial layer 230 may include strontium titanium oxide ($SrTiO_3$). In another embodiment, when the interfacial oxide layer 130 includes barium oxide (BaO) and the gate electrode layer 140 includes titanium (Ti) or titanium nitride (TiN), then the ferroelectric interfacial layer 230 may include barium titanium oxide ($BaTiO_3$). In yet another embodiment, when the interfacial oxide layer includes yttrium oxide ($Y_2O_3$) and the gate electrode layer 140 includes titanium (Ti) or titanium nitride (TiN), then the ferroelectric interfacial layer 230 may include yttrium titanium oxide ($YTiO_3$).

Consequently, the ferroelectric layer 122 and the ferroelectric interfacial layer 230 both have ferroelectric properties after performing the crystallization heat treatment. As illustrated, the ferroelectric layer 122 and the ferroelectric interfacial layer 230 are part of a structure in which different thin films are stacked.

Figure 6:
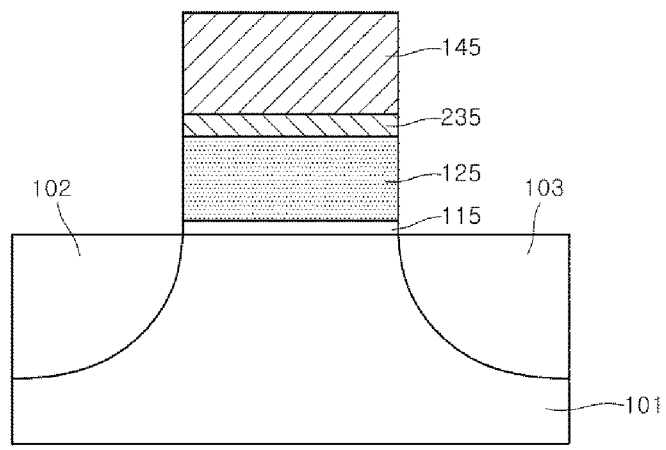
Figure 6:
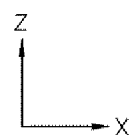

Subsequently, referring to FIG. 6, the gate electrode layer 140, the ferroelectric interfacial layer 230, the ferroelectric layer 122 and the interfacial insulating layer 110 may be patterned on the substrate 101, resulting in a gate electrode pattern 145, a ferroelectric interfacial layer pattern 235, a ferroelectric layer pattern 125, and an interfacial insulating layer pattern 115. Then, a source region 102 and a drain region 103 may be formed in the substrate 101 at opposite ends of the interfacial insulating layer pattern 115. The source region 102 and the drain region 103 may be formed by doping portions of the substrate 101 with a conductivity type opposite to the conductivity type of the substrate 101. As an example, when the substrate 101 is a doped p-type substrate, the source region 102 and the drain region 103 may be doped into n-type.

By performing the above-described processes, a ferroelectric memory device according to an embodiment of the present disclosure can be manufactured. According to embodiments of the present disclosure, in the crystallization heat treatment process for the ferroelectric layer, the metal oxide in the interfacial oxide layer including a first metal element and the gate electrode layer including a second metal element are in contact and react with each other to convert the interfacial oxide layer into a ferroelectric interfacial oxide layer. Accordingly, in the crystallization heat treatment process, the generation of an interfacial dielectric layer with paraelectric properties and located between the ferroelectric layer and the gate electrode layer can be avoided by producing the ferroelectric interfacial oxide layer instead.

Figure 7:
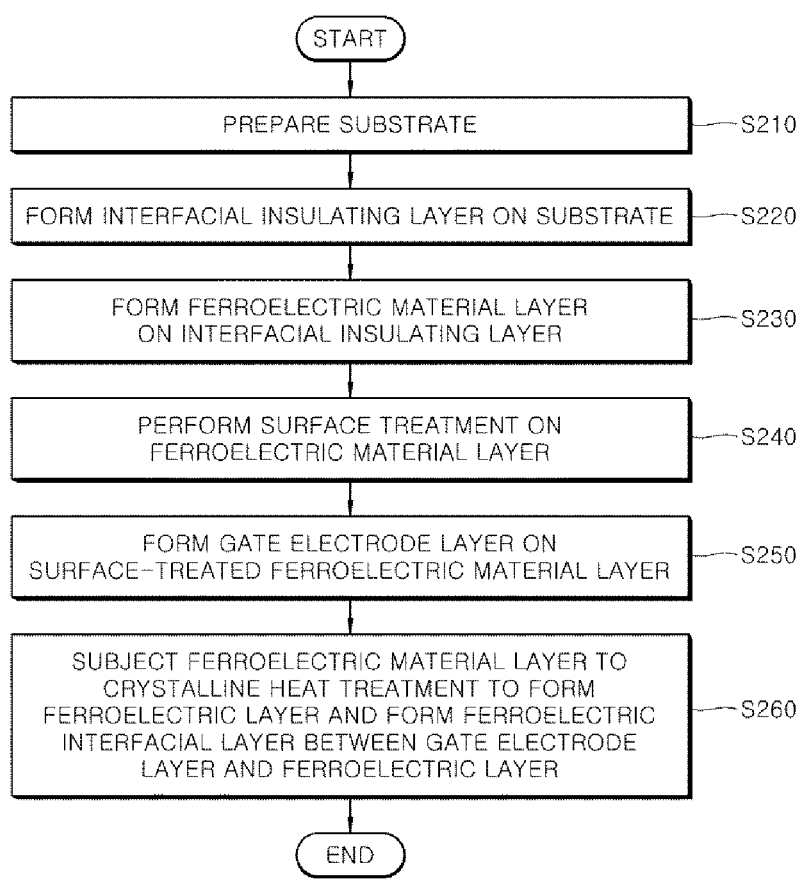
FIG. 7 is a flow chart illustrating a method of manufacturing a ferroelectric memory device according to another embodiment of the present disclosure.

FIG. 7 is a flow chart illustrating a method of manufacturing a ferroelectric memory device according to another embodiment of the present disclosure. FIGS. 8 to 12 are cross-sectional views schematically illustrating a method of manufacturing the ferroelectric memory device according to an embodiment of the present disclosure.

Figure 8:
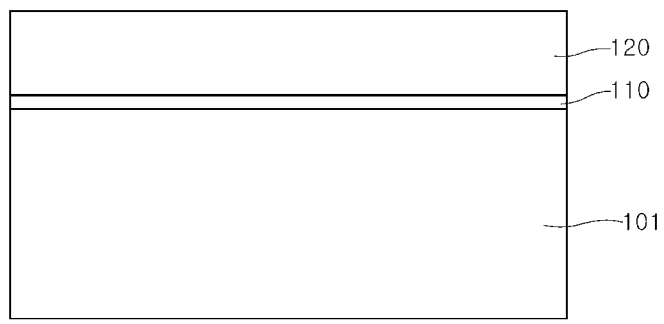
FIGS. 8 to 12 are cross-sectional views schematically illustrating a method of manufacturing a ferroelectric memory device according to another embodiment of the present disclosure.

Referring to operations S210 to 230 of FIG. 7 and FIG. 8, a substrate 101 may be prepared. A configuration of the substrate 101 may be the same as a configuration of the substrate 101 described above and with reference to S110 of FIG. 2 and FIG. 3. Next, an interfacial insulating layer 110 may be formed or disposed on the substrate 101. Then, a ferroelectric material layer 120 may be formed or disposed on the interfacial insulating layer 110. The interfacial insulating layer 110 and the ferroelectric material layer 120 may be formed in substantially the same manner as the process described above and with reference to operations S110 to S130 of FIG. 2 and FIG. 3.

Figure 9:
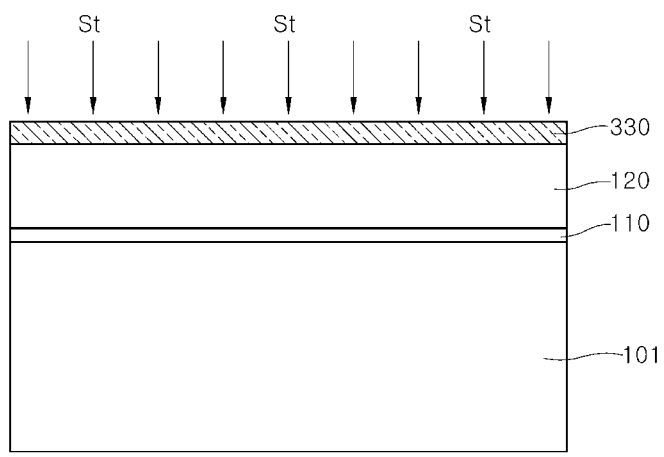

Referring to operation S240 of FIG. 7 and FIG. 9, a surface treatment (St) may be performed on the ferroelectric material layer 120. In an embodiment, the surface treatment St may include doping a surface region of the ferroelectric material layer 120 with a dopant. The doping process may include, for example, implanting a metal element dopant into the surface region through an ion implantation process. As a result, a surface treatment layer 330 doped with the metal element may be formed in the ferroelectric material layer 120.

The metal element as the dopant that is implanted in the surface treatment (St) can be chosen based on whether the metal element forms a ferroelectric interfacial layer by reacting with materials in the gate electrode 340 during a crystallization heat treatment described below and with reference to operation S260 of FIG. 7 and FIG. 11. That is, the metal element may be chosen based on the type of material contained in a gate electrode layer 340 in order to form the ferroelectric interfacial layer to be described with reference to operation S250 of FIG. 7 and FIG. 10.

In an embodiment, when the gate electrode layer 340 includes tantalum (Ta) or tantalum nitride (TaN), the dopant may include potassium (K). In another embodiment, when the gate electrode layer 340 includes tungsten (W) or tungsten nitride (WN), the dopant may include sodium (Na).

Figure 10:
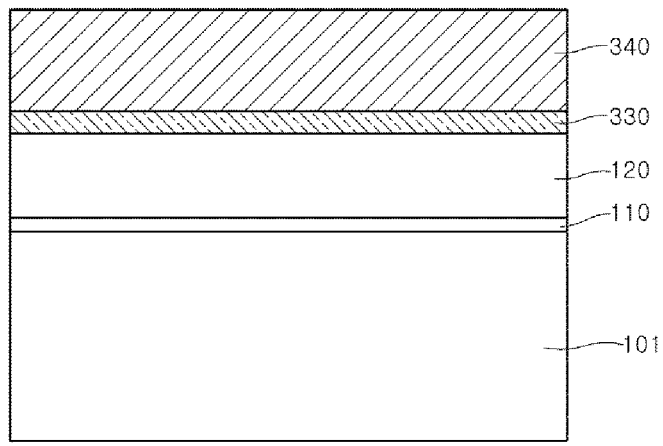

Referring to operation S250 of FIG. 7, and FIG. 10, the gate electrode 340 may be formed on the surface-treated ferroelectric material layer 120. The gate electrode layer 340 may include a different metal element that differs from the dopant implanted into the ferroelectric material layer 120.

The gate electrode layer 340 may include, for example, tantalum (Ta), tungsten (W), tantalum nitride (TaN), tungsten nitride (WN), or a combination of two or more thereof. The gate electrode layer 340 may be formed, for example, using a chemical vapor deposition method, an atomic layer deposition method, or a sputtering method.

Figure 11:
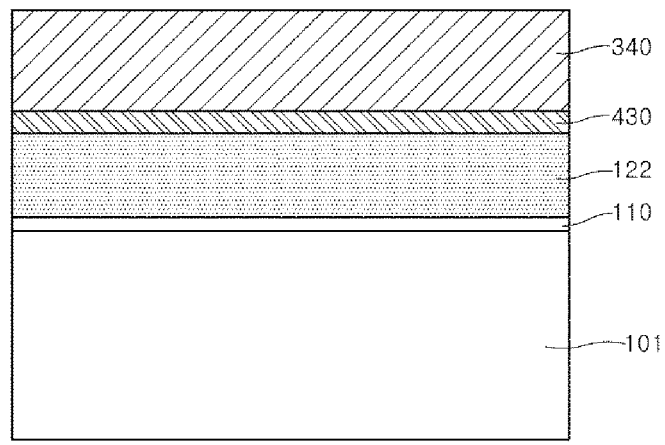

Referring to operation S260 of FIG. 7 and FIG. 11, the ferroelectric material layer 120 may be subjected to a crystallization heat treatment to form a ferroelectric layer 122. The crystallization heat treatment may be performed, for example, at a processing temperature of about 500° C. to about 1000° C. In an embodiment, the crystalline heat treatment may be performed in an oxygen ambient. In another embodiment, the crystalline heat treatment may be performed in an inert gas ambient such as nitrogen or argon gas ambient. In an embodiment, the crystallization heat treatment may be performed with the gate electrode layer 340 disposed on the surface treatment layer 330. The gate electrode layer 340 may function as a capping layer for the ferroelectric material layer 120 and the surface treatment layer 330. The ferroelectric layer 122 may have a thickness of about seven (7) nm to about fifteen (15) nm, for example.

In the crystallization heat treatment process, the surface treatment layer 330 may react with materials in the gate electrode layer 340 to form a ferroelectric interfacial layer 430 having ferroelectric properties. The ferroelectric interfacial layer 430 may include a metal oxide. When the surface treatment layer 330 includes a first metal element as a dopant, and the gate electrode layer 340 includes a second metal element different from the first metal element, then the metal oxide may include both the first and second metal elements. The ferroelectric interfacial layer 430 may have a thickness of about one (1) nm to about one and half (1.5) nm, for example.

In an embodiment, when the surface treatment layer 330 includes potassium (K) as a dopant and the gate electrode layer 340 includes tantalum (Ta) or tantalum nitride (TaN), then the ferroelectric interfacial layer 430 may include potassium tantalum oxide ($KTaO_3$). In another embodiment, when the surface treatment layer 330 includes sodium (Na) as a dopant and the gate electrode layer 340 includes tungsten (W) or tungsten nitride (WN), then the ferroelectric interfacial layer 430 may include sodium tungsten oxide ($NaTaO_3$).

Consequently, the ferroelectric layer 122 and the ferroelectric interfacial layer 430 each have ferroelectricity resulting from the crystallization heat treatment. As illustrated, the ferroelectric layer 122 and the ferroelectric interfacial layer 430 are included in a structure in which different thin films are stacked.

Figure 12:
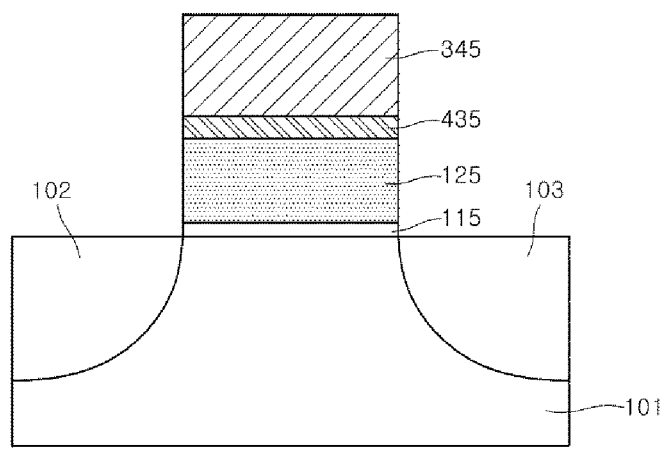

Subsequently, referring to FIG. 12, the gate electrode layer 340, the ferroelectric interfacial layer 430, the ferroelectric layer 122, and the interfacial insulating layer 110 may be patterned on the substrate 101 to form a gate electrode pattern 345, a ferroelectric interfacial layer pattern 435, a ferroelectric layer pattern 125, and an interfacial insulating layer pattern 115. Then, a source region 102 and a drain region 103 may be formed in the substrate 101 at opposite ends of the interfacial insulating layer pattern 115. The method of forming the source region 102 and the drain region 103 is the same as the method of forming the source region 102 and the drain region 103 described above and with reference to FIG. 6. By performing the above-described processes, a ferroelectric memory device according to an embodiment of the present disclosure can be manufactured.

Figure 13:
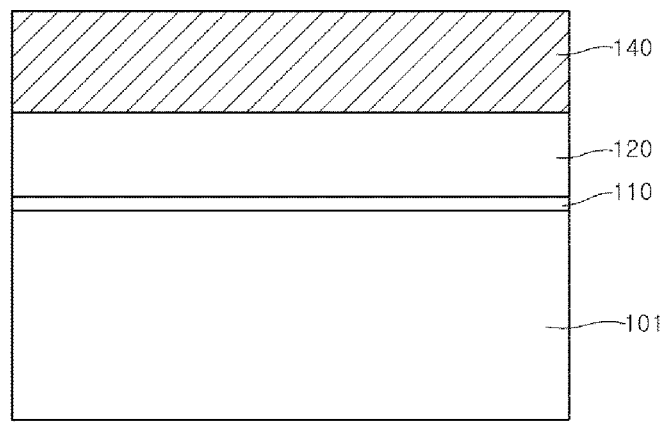
FIGS. 13 to 15 are cross-sectional views schematically illustrating a method of manufacturing a ferroelectric memory device according to a comparative example.
Figure 13:
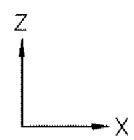
Figure 14:
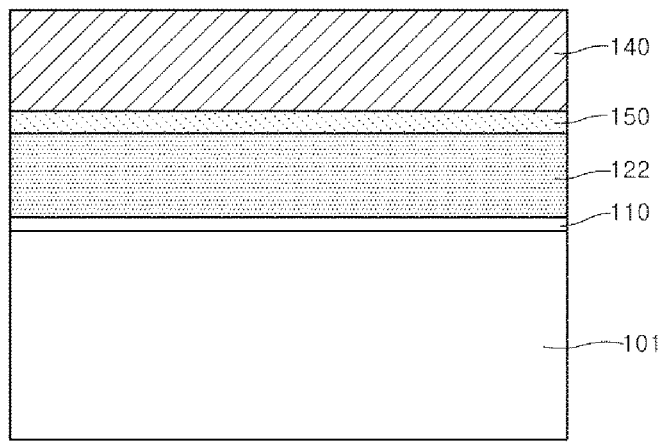
Figure 15:
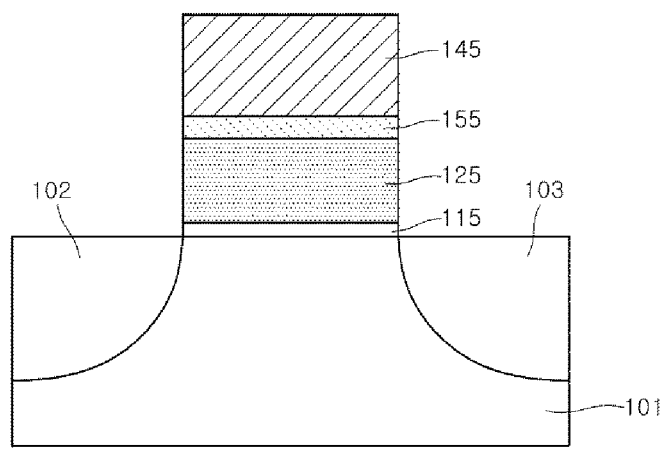
Figure 15:
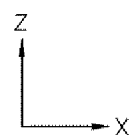

FIGS. 13 to 15 are views schematically illustrating a method of manufacturing a ferroelectric memory device according to a comparative example. The manufacturing method used in the comparative example differs from the manufacturing method according to the embodiments of the present disclosure in that a ferroelectric interfacial layer is not formed between a ferroelectric material layer 120 and a gate electrode layer 140.

Referring to FIG. 13, an interfacial insulating layer 110, the ferroelectric material layer 120 and the gate electrode layer 140 may be sequentially formed on a substrate 101. The substrate 101 may have a configuration that is substantially the same as that of the substrate 101 described above and with reference to operation S110 of FIG. 2 and FIG. 3.

Methods of forming the interfacial insulating layer 110, the ferroelectric material layer 120 and the gate electrode layer 140 may be substantially the same as the methods described above and with reference to operations S110 to S130 and S150 of FIG. 2 and FIGS. 3 and 4, for example.

Referring to FIG. 14, the ferroelectric material layer 120, which is in an amorphous state, may be subjected to crystallization heat treatment, using the gate electrode layer 140 as a capping layer, to form a ferroelectric layer 122. In the crystallization heat treatment process, the ferroelectric material layer 120 and the gate electrode layer 140 react with each other to form an interfacial dielectric layer 150 having paraelectricity.

As an example, when the ferroelectric material layer 120 includes hafnium oxide ($HfO_3$) or zirconium oxide (ZrO) and the gate electrode layer 140 includes titanium (Ti) or titanium nitride (TiN), then the interfacial dielectric layer 150 (including titanium oxide) having paraelectric characteristics may be formed during the crystallization heat treatment process.

Referring to FIG. 15, the gate electrode layer 140, the interfacial dielectric layer 150, the ferroelectric layer 122, and the interfacial insulating layer 110 may be patterned on the substrate 101 to form a gate electrode pattern 145, an interfacial dielectric layer pattern 155, a ferroelectric layer pattern 125, and an interfacial insulating layer pattern 115. Next, a source region 102 and a drain region 103 may be formed in the substrate 101 at respective ends of the interfacial insulating layer pattern 115. The method of forming the source region 102 and the drain region 103 may be substantially the same as the method of forming the source region 102 and the drain region 103 described above and with reference to FIG. 12, for example. By performing the above-described process, the ferroelectric memory device according to a comparative example can be manufactured.

Figure 16A:
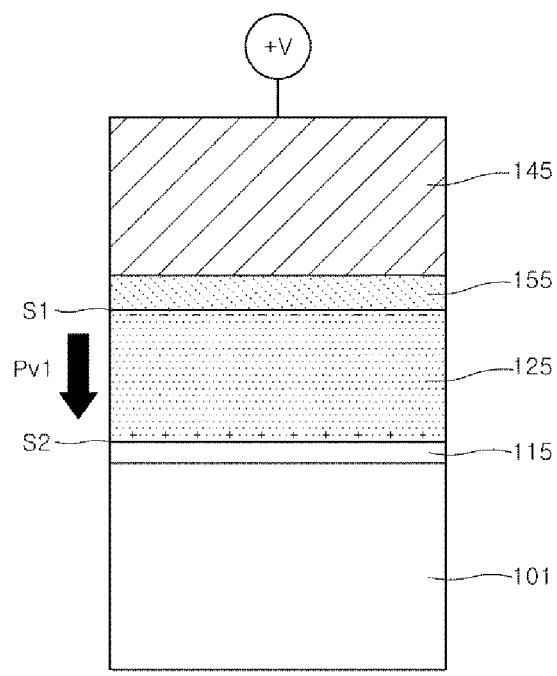
FIGS. 16A and 16B are views schematically illustrating operations of a ferroelectric memory device according to a comparative example.
Figure 16B:
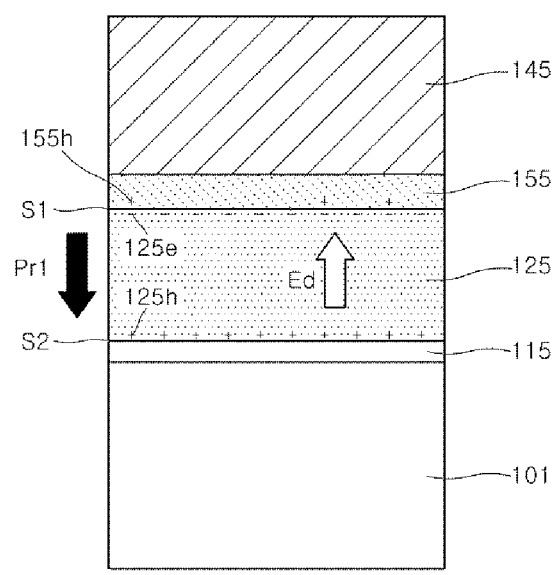

FIGS. 16A and 16B are views schematically illustrating operations of a ferroelectric memory device 2 according to a comparative example. The ferroelectric memory device 2 of FIGS. 16A and 16B may be manufactured by the manufacturing method described above and with reference to FIGS. 13 to 15.

Referring to FIG. 16A, a writing voltage having a positive polarity may be applied to a gate electrode pattern 145 of the ferroelectric memory device 2. At this time, polarization Pv1 of a ferroelectric layer pattern 125 may be aligned with an electric field formed by the write voltage. Polarization Pv1 may arrange negative electric charges in an inner region of the ferroelectric layer pattern 125 at or near a first interface S1, which is between the ferroelectric layer pattern 125 and an interfacial dielectric layer pattern 155. In addition, polarization Pv1 may arrange positive electric charges in an inner region of the ferroelectric layer pattern 125 at or near a second interface S2, which is between the ferroelectric layer pattern 125 and an interfacial insulating layer pattern 115.

Referring to FIG. 16B, when the writing voltage applied to the gate electrode pattern 145 is removed, remanent polarization Pr1 may be formed in the ferroelectric layer pattern 125 with the same orientation as Pv1. Under the influence of remanent polarization Pr1, negative electric charges 125e may be arranged in an inner region of the ferroelectric layer pattern 125 at or near the first interface S1. In addition, positive electric charges may be arranged in an inner region of the ferroelectric layer pattern 125 at or near the second interface S2.

At this time, the interfacial dielectric layer pattern 155, which is paraelectric, may not have a sufficient amount of positive electric charges 155h to screen or offset the negative electric charges 125e in the inner region of the interfacial dielectric layer pattern 155. Accordingly, the negative electric charges 125e which are not screened, and positive electric charges 125h distributed in the inner region of the ferroelectric layer pattern 125 near second interface S2, form a depolarization electric field Ed inside the ferroelectric layer pattern 125.

The depolarization electric field Ed may have a direction opposite to an orientation of the remnant polarization Pr1, thereby reducing the magnitude of the remnant polarization Pr1. As a result, because the stability of the stored logic information depends on the remanent polarization of the ferroelectric layer pattern 125, remanent polarization and other ferroelectric characteristics may be degraded.

Although not illustrated, when a writing voltage having a negative polarity is applied to the gate electrode pattern 145, the remanent polarization and depolarization electric field that have different directions may be maintained in the inner region of the ferroelectric layer pattern 125 even after the writing voltage is removed. The interfacial dielectric layer pattern 155 cannot sufficiently screen or neutralize the positive electric charges that are arranged in the inner region of the ferroelectric layer pattern 125 at or near the first interface S1, so a depolarization electric field may be generated. The depolarization electric field can reduce the magnitude of the remanent polarization in derogation of ferroelectric characteristics of the ferroelectric layer pattern 125 and of the function of the ferroelectric memory device.

FIGS. 17A and 17B are views schematically illustrating operations of a ferroelectric memory device according to an embodiment of the present disclosure. The ferroelectric memory device 1 of FIGS. 17A and 17B may be manufactured, for example, using the manufacturing methods described above and with reference to FIGS. 3 to 6, for example.

Referring to FIG. 17A, a write voltage having a positive polarity may be applied to a gate electrode pattern 145 of the ferroelectric memory device 1.

Polarization Pv2 of a ferroelectric layer pattern 125 may be aligned with an electric field formed by a writing voltage. Polarization Pv2 may arrange negative electric charges in an inner region of the ferroelectric layer pattern 125 at or near a first interface S10, which is between the ferroelectric layer pattern 125 and a ferroelectric interfacial layer pattern 235. In addition, Polarization Pv2 may arrange positive electric charges in an inner region of ferroelectric layer pattern 125 at or near a second interface S20, which is between the ferroelectric layer pattern 125 and an interfacial insulating layer pattern 115 by the polarization Pv2.

Meanwhile, polarization Pv3 of the ferroelectric interfacial layer pattern 235 may be aligned with an electric field formed by the writing voltage. Positive electric charges may be induced by polarization Pv3 to collect in an inner region of the ferroelectric interfacial layer pattern 235 at or near the first interface S10, which is between the ferroelectric layer pattern 125 and the ferroelectric interfacial layer pattern 235. In addition, negative electric charges may be induced to accumulate near a third interface S30, which is between the ferroelectric interfacial layer pattern 235 and the gate electrode pattern 145.

Referring to FIG. 17B, when the writing voltage applied to the gate electrode pattern 145 is removed, remanent polarization Pr2 may be retained in the ferroelectric layer pattern 125. Negative electric charges 125n may be arranged in an inner region of the ferroelectric layer pattern 125 at or near first interface S10 in response to the remanent polarization Pr2. In addition, positive electric charges 125p may aggregate in an inner region of the ferroelectric layer pattern 125 at or near the second interface S20.

Similarly, remanent polarization Pr3 may be formed in the ferroelectric interfacial layer pattern 235. Positive electric charges 235p may be arranged in an inner region of the ferroelectric interfacial layer pattern 235 at or near the first interface S10, in response to the remanent polarization Pr3. In addition, negative electric charges 235n may be arranged in an inner region of the ferroelectric interfacial layer pattern 235 at or near the third interface S30. Further, positive electric charges 145p may collect in an inner region of the gate electrode pattern 145 at or near the third interface S30.

Referring again to FIG. 17B, the ferroelectric interfacial layer pattern 235 may have an amount of positive electric charges 235p, enough to screen the negative electric charges 125n of the ferroelectric layer pattern 125 at the first interface S10. In addition, because the gate electrode pattern 145 has electric charges, the gate electrode pattern 145 may have an amount of positive electric charges 145p sufficient to offset the negative electric charges 125n of the ferroelectric interfacial layer pattern 235 near the third interface S30. Accordingly, formation of depolarization electric fields inside the ferroelectric layer pattern 125 and inside ferroelectric interfacial layer pattern 235 is avoided. As a result, the phenomenon of ferroelectricity degradation of the ferroelectric layer pattern 125 and ferroelectric interfacial layer pattern 235 due to the depolarization electric fields can be suppressed or limited.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A method of manufacturing a ferroelectric memory device, the method comprising:
   preparing a substrate;
   forming an interfacial insulating layer on the substrate;
   forming a ferroelectric material layer on the interfacial insulating layer;
   forming an interfacial oxide layer comprising a first metal element directly on the ferroelectric material layer, the interfacial oxide layer having non-ferroelectric properties;
   forming a gate electrode layer comprising a second metal element on the interfacial oxide layer; and
   subjecting the ferroelectric material layer and the interfacial oxide layer to a crystallization heat treatment to form a ferroelectric layer from the ferroelectric material layer and a ferroelectric interfacial layer from a reaction of the interfacial oxide layer and the gate electrode layer,
   wherein the interfacial oxide layer reacts with the gate electrode layer so that the ferroelectric interfacial layer comprises the first and second metal elements,
   wherein forming the ferroelectric interfacial layer includes suppressing an interfacial dielectric layer having paraelectricity from being formed between the ferroelectric layer and the gate electrode layer after the crystallization heat treatment,
   wherein both the ferroelectric layer and the ferroelectric interfacial layer have ferroelectric properties after performing the crystallization heat treatment, and
   wherein the ferroelectric layer is configured to retain a remanent polarization as a logic information.

2. The method of claim 1, wherein the ferroelectric material layer comprises at least one of hafnium oxide and zirconium oxide.

3. The method of claim 1, wherein the ferroelectric interfacial layer has a thickness of 1 nm to 1.5 nm.

4. The method of claim 1, wherein the interfacial oxide layer comprises strontium oxide (SrO), the gate electrode layer comprises titanium (Ti) or titanium nitride (TiN), and the ferroelectric interfacial layer comprises strontium titanium oxide (SrTiO3).

5. The method of claim 1, wherein the interfacial oxide layer comprises barium oxide (BaO), the gate electrode layer comprises titanium (Ti) or titanium nitride (TiN), and the ferroelectric interfacial layer comprises barium titanium oxide (BaTiO3).

6. The method of claim 1, wherein the interfacial oxide layer comprises yttrium oxide (Y2O3), the gate electrode layer comprises titanium (Ti) or titanium nitride (TiN), and the ferroelectric interfacial layer comprises yttrium titanium oxide (YTiO3).

7. The method of claim 1, wherein the crystallization heat treatment is performed at a process temperature of 500° C. to 1000° C., and the gate electrode layer is a capping layer for the crystallization heat treatment.

8. A method of manufacturing a ferroelectric memory device, the method comprising:
   preparing a substrate;
   forming an interfacial insulating layer on the substrate;
   forming a ferroelectric material layer on the interfacial insulating layer;
   performing a surface treatment on the ferroelectric material layer by doping a surface region of the ferroelectric material layer with a dopant of a first metal element to form a surface treatment layer;
   forming a gate electrode layer comprising a second metal element on the surface treatment layer; and
   subjecting the ferroelectric material layer to a crystallization heat treatment to form a ferroelectric layer,
   wherein the surface treatment layer reacts with the gate electrode layer to form a ferroelectric interfacial layer between the ferroelectric layer and the gate electrode layer during the crystallization heat treatment,
   wherein the ferroelectric interfacial layer includes the first and second metal elements, and
   wherein forming the ferroelectric interfacial layer includes suppressing an interfacial dielectric layer having paraelectricity from being formed between the ferroelectric layer and the gate electrode layer after the crystallization heat treatment.

9. The method of claim 8,
   wherein the ferroelectric interfacial layer has ferroelectric properties after performing the crystallization heat treatment, and
   wherein the ferroelectric layer is configured to retain a remanent polarization as a logic information.

10. The method of claim 8, wherein the dopant comprises potassium (K), the gate electrode layer comprises tantalum (Ta) or tantalum nitride (TaN), and the ferroelectric interfacial layer comprises potassium tantalum oxide (KTaO3).

11. The method of claim 8, wherein the dopant comprises sodium (Na), the gate electrode layer comprises tungsten (W) or tungsten nitride (WN), and the ferroelectric interfacial layer comprises sodium tungsten oxide (NaWO3).

12. The method of claim 8, wherein the crystallization heat treatment is performed at a process temperature of 500° C. to 1000° C., and the gate electrode layer is a capping layer for the crystallization heat treatment.

13. The method of claim 8, wherein the ferroelectric interfacial layer has a thickness of 1 nm to 1.5 nm.

* * * * *